United States Patent
Kang (10) Patent No.: US 8,344,309 B2
(45) Date of Patent: Jan. 1, 2013

(54) METHOD AND CIRCUIT FOR CALIBRATING PHASE, AND SIGNAL PROCESSING APPARATUS HAVING THE SAME

(75) Inventor: Byoung Joong Kang, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 357 days.

(21) Appl. No.: 12/836,325

(22) Filed: Jul. 14, 2010

(65) Prior Publication Data

US 2011/0050474 A1 Mar. 3, 2011

(30) Foreign Application Priority Data

Sep. 1, 2009 (KR) .................. 10-2009-0082144

(51) Int. Cl.
*H01J 40/14* (2006.01)

(52) U.S. Cl. .................. 250/214 R; 250/214.1

(58) Field of Classification Search ............. 250/214 R, 250/214.1, 214 DC; 455/63.4, 115.1, 115.2, 455/67.1–67.4, 73; 327/148, 141, 153; 713/401
See application file for complete search history.

(56) References Cited

U.S. PATENT DOCUMENTS 6,704,551 B2 * 3/2004 Riou et al. .................. 455/115.1
7,146,146 B2 12/2006 Masenten et al.

FOREIGN PATENT DOCUMENTS

| JP | 11-041308 | 2/1999 |
| KR | 1020050096173 | 10/2005 |
| KR | 1020080082737 | 9/2008 |

* cited by examiner

*Primary Examiner* — Que T Le
(74) *Attorney, Agent, or Firm* — F. Chau & Associates, LLC (57) ABSTRACT

A method for calibrating a phase include comparing a phase of an in-phase output signal and a phase of a quadrature-phase output signal and generating a digital code corresponding to a comparison result, and controlling the phase of the in-phase output signal in response to quadrature-phase differential input signals and the digital code, and controlling the phase of the quadrature-phase output signal in response to in-phase differential input signals and the digital code, to make a phase difference between the in-phase output signal and the quadrature-phase output signal 90°.

10 Claims, 6 Drawing Sheets

METHOD AND CIRCUIT FOR CALIBRATING PHASE, AND SIGNAL PROCESSING APPARATUS HAVING THE SAME

CROSS-REFERENCE TO RELATED APPLICATIONS

This application claims priority under 35 U.S.C. §119 to Korean Patent Application No. 10-2009-0082144, filed on Sep. 1, 2009, in the Korean Intellectual Property Office, the disclosure of which is incorporated by reference herein in its entirety.

BACKGROUND

The inventive concept relates to a phase calibration technology, and more particularly, to a method and circuit for calibrating a phase to make the phase difference between an in-phase signal and a quadrature phase signal to be 90°, and a transceiver having the phase calibration method and circuit.

A method of adjusting a phase difference between an in-phase signal and a quadrature phase signal by finely controlling a DC operating point of a divider for generating the quadrature phase signal is used in a transmitter. In this case, since the oscillation frequency is twice the local frequency, the method may not be applied for a high frequency system.

Thus, in a high frequency system, the in-phase signal and the quadrature phase signal having the same frequency as the oscillation frequency is generated by using a polyphase filter or a quadrature voltage controlled oscillator (QVCO). However, the polyphase filter or the QVCO does not use a divider, the method of adjusting a phase difference using a DC operating point of the divider may not be used therefor.

SUMMARY

The inventive concept provides a method and circuit for automatically calibrating a phase difference between an in-phase signal and a quadrature phase signal in a communications system using a high frequency or in a broadband system such as an ultra wideband (UWB), and a transmitter or receiver having the circuit.

According to an aspect of the inventive concept, there is provided a method for calibrating a phase which includes comparing a phase of an in-phase output signal and a phase of a quadrature-phase output signal and generating a digital code corresponding to a comparison result, and controlling the phase of the in-phase output signal in response to quadrature-phase differential input signals and the digital code, and controlling the phase of the quadrature-phase output signal in response to in-phase differential input signals and the digital code, to make a phase difference between the in-phase output signal and the quadrature-phase output signal 90°.

The generating of the digital code may include detecting a phase difference between the in-phase output signal and the quadrature-phase output signal and generating a plurality of detection signals, performing low pass filtering on each of the plurality of detection signals and generating low pass filtered DC signals, comparing the DC signals and generating a comparison signal; and generating the digital code in response to the comparison signal and a clock signal.

In the generating of the digital code in response to the comparison signal and the clock signal, the digital code that is up-counted or down-counted according to the level of the comparison signal, the most significant bit of the digital code, and the clock signal, may be generated. The most significant bit may be determined based on whether the phase difference between the in-phase output signal and the quadrature-phase output signal is greater or less than 90° at the initial stage of a phase calibration operation.

According to another aspect of the inventive concept, there is provided a circuit for calibrating phases of signals output from a local oscillator, which includes a first buffer for outputting an in-phase output signal, a second buffer for outputting a quadrature-phase output signal, a code generation circuit for comparing a phase of the in-phase output signal and a phase of the quadrature-phase output signal and generating a digital code corresponding to a comparison result, and a phase calibration circuit for controlling the phase of the in-phase output signal in response to quadrature-phase differential input signals and the digital code, and controlling the phase of the quadrature-phase output signal in response to in-phase differential input signals and the digital code, to make the phase difference between the in-phase output signal and the quadrature-phase output signal 90°.

The code generation circuit may include a phase detector for detecting the phase difference between the in-phase output signal and the quadrature-phase output signal and generating a first detection signal and a second detection signal, a low pass filter for performing low pass filtering on each of the first and second detection signals and generating a first filter signal and a second filter signal, a comparator for comparing the first and second filter signals and outputting a comparison signal, and a code generator for generating the digital code according to a clock signal and the comparison signal. The phase detector may include an XOR gate to generate the first detection signal and an XNOR gate to generate the second detection signal.

The code generator may generate the digital code that is up-counted or down-counted according to a level of the comparison signal and the clock signal. The code generator may generate a calibration control signal to control an operation of the comparator based on a change of the level of the comparison signal.

The phase calibration circuit may include a first digital-to-analog converter for controlling the phase of the in-phase output signal in response to the quadrature-phase differential input signals and the digital code, and a second digital-to-analog converter for controlling the phase of the quadrature-phase output signal in response to the in-phase differential input signals and the digital code.

The first digital-to-analog converter may include a plurality of first digital-to-analog units to control the phase of the in-phase output signal, each of the plurality of first digital-to-analog units being connected in parallel to output terminals of the first buffer, the second digital-to-analog converter comprises a plurality of second digital-to-analog units to control the phase of the quadrature-phase output signal, each of the plurality of second digital-to-analog units being connected in parallel to output terminals of the second buffer, and each of the plurality of first digital-to-analog units and each of the plurality of second digital-to-analog units are enabled/disabled based on the most significant bit of the digital code. The most significant bit may be determined based on whether the phase difference between the in-phase output signal and the quadrature-phase output signal is greater or less than 90° at the initial stage of a phase calibration operation.

According to another aspect of the inventive concept, there is provided a wireless signal processing apparatus which includes a first buffer for outputting an in-phase output signal, a second buffer for outputting a quadrature-phase output signal, a first mixer for mixing an output signal of the first buffer and an in-phase baseband output signal, a second mixer for mixing an output signal of the second buffer and a quadrature-phase baseband output signal, a code generation circuit for comparing a phase of the in-phase output signal and a phase of the quadrature-phase output signal and generating a digital code corresponding to a comparison result, and a phase calibration circuit for controlling the phase of the in-phase output signal in response to quadrature-phase differential input signals and the digital code, and controlling the phase of the quadrature-phase output signal in response to in-phase differential input signals and the digital code, to make a phase difference between the in-phase output signal and the quadrature-phase output signal 90°.

The code generation circuit may generate a calibration control signal to control the operations of the first mixer, the second mixer, and the comparator based on a change of the level of the comparison signal. Also, the code generator may generate the calibration control signal to control the operations of the first mixer, the second mixer, and the comparator when the digital code reaches the maximum value or the minimum value.

The code generator may generate a calibration control signal based on a change of a level of the comparison signal. The wireless signal processing apparatus may further include a switch for transmitting the in-phase output signal and the quadrature-phase output signal to the code generation circuit in response to the calibration control signal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

Figure 1:
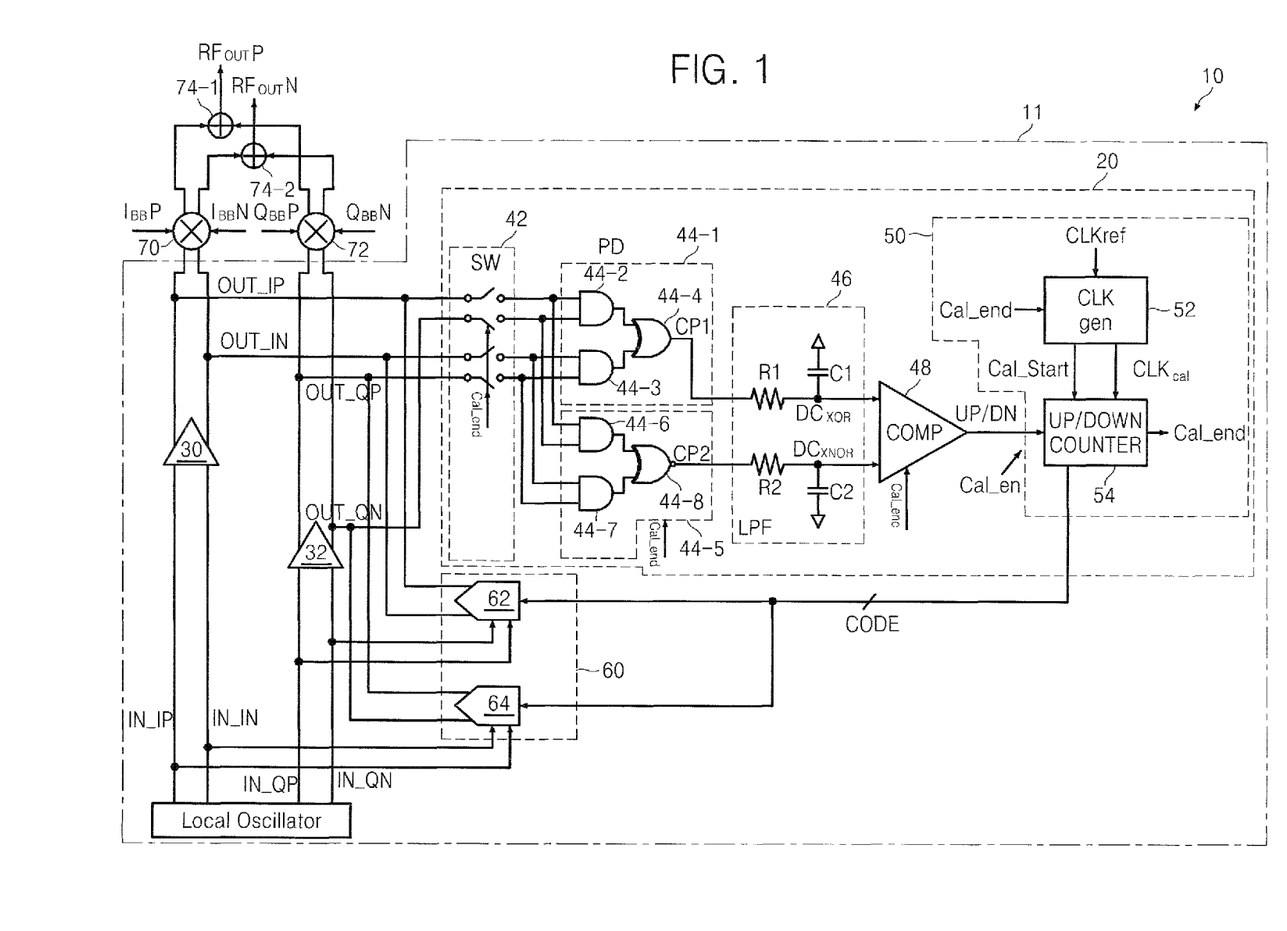
FIG. 1 is a circuit diagram of a transmitter including a phase auto-calibration circuit according to an exemplary embodiment of the present inventive concept.

FIG. 1 is a circuit diagram of a transmitter 10 including a phase auto-calibration circuit 11 according to an exemplary embodiment of the present inventive concept. Referring to FIG. 1, the transmitter 10 includes the phase auto-calibration circuit 11, a first mixer 70, a second mixer 72, a first adder 74-1, and a second adder 74-2.

Although FIG. 1 illustrates the transmitter 10 for convenience of explanation, the phase auto-calibration circuit 11 according to the present inventive concept may be applied to a receiver. In such case, as the first mixer 70 and the second mixer 72 that are up-conversion mixers are replaced by down-conversion mixers and a first output signal $RF_{OUT}P$ is replaced by a baseband input, the phase auto-calibration circuit 11 may be applied to a receiver. Since the transmitter 10 and the receiver require signals output from separate local oscillators, the phase auto-calibration circuit 11 used for the transmitter 10 and the receiver may be separately implemented. Thus, although in the present specification the term "transmitter" is used for convenience of explanation, the term is interpreted to be a wireless signal processing apparatus including all of the transmitter, the receiver, or a transceiver.

The transmitter 10 performs a normal operation, for example, when a calibration control signal Cal_end is a high level, and a phase auto-calibration operation, for example, when the calibration control signal Cal_end is a low level. During the normal operation of the transmitter 10, the first mixer 70 mixes an in-phase first differential output signal (hereinafter, referred to as the output I signal OUT_IP) and an in-phase baseband first signal $I_{BB}P$ to generate a first output signal, and mixes an in-phase second differential output signal OUT_IN and an in-phase baseband second signal $I_{BB}N$ to generate a second output signal. For example, the in-phase baseband first signal $I_{BB}P$ and the in-phase baseband second signal $I_{BB}N$ are differential signals.

The second mixer 72 mixes a quadrature phase first differential output signal (hereinafter, referred to as the output Q signal OUT_QP) and a quadrature-phase baseband first signal $Q_{BB}P$ to generate a third output signal, and mixes a quadrature-phase second differential output signal OUT_QN and a quadrature-phase baseband second signal $Q_{BB}N$ to generate a fourth output signal. For example, the quadrature-phase baseband first signal $Q_{BB}P$ and the quadrature-phase baseband second signal $Q_{BB}N$ are differential signals.

The first adder 74-1 add the first output signal of the first mixer 70 and the third output signal of the second mixer 72 to generate a first output signal $RF_{OUT}P$. The second adder 74-2 add the second output signal of the first mixer 70 and the fourth output signal of the second mixer 72 to generate a second output signal $RF_{OUT}N$.

Although, for convenience of explanation, the output I signal OUT_IP of the in-phase differential output signals OUT_IP and OUT_IN and the output Q signal OUT_QP of the quadrature-phase differential output signals OUT_QP and OUT_QN are described for example, the exemplary embodiment of the present inventive concept may be equally or similarly applied to the signals OUT_IN and OUT_QN.

During the phase auto-calibration operation of the transmitter 10, the first mixer 70, the second mixer 72, the first adder 74-1, and the second adder 74-2 are disabled, and the phase auto-calibration circuit 11 performs a phase auto-calibration operation. The phase auto-calibration circuit 11 controls a phase difference between the output I signal OUT_IP and the output Q signal OUT_QP, to be 90°, based on the phase difference between the output I signal OUT_IP and the output Q signal OUT_QP.

The phase auto-calibration circuit 11 may include a code generation circuit 20, a phase calibration circuit 60, a first buffer 30, and a second buffer 32. The code generation circuit 20 receives the output I signal OUT_IP output from the first buffer 30 and the output Q signal OUT_QP output from the second buffer 32, and generates a digital code CODE to control the phase difference between the received signal OUT_IP and OUT_QP to be 90°. The digital code CODE may consist of a plurality of bits. The code generation circuit 20 may include a switch SW 42, a phase detector PD, a low pass filter 46, a comparator COMP 48, and a code generator 50. The phase detector PD includes a first phase detector 44-1 and a second phase detector 44-5. The first phase detector 44-1 may be implemented by an XOR gate, and the second phase detector 44-5 may be implemented by an XNOR gate.

During the phase auto-calibration operation, the calibration control signal Cal_end is a low level. Thus, since the switch SW 42 is turned on in response to the calibration control signal Cal_end having a low level, the output I signal OUT_IP output from the first buffer 30 and the output signal OUT_QN output from the second buffer 32 are transmitted to the first phase detector 44-1, and the output signal OUT_IN output from the first buffer 30 and the output Q signal OUT_QP output from the second buffer 32 are transmitted to the second phase detector 44-5.

Each of the phase detectors 44-1 and 44-5 is enabled in response to the calibration control signal Cal_end having a low level. The first phase detector 44-1 includes a first AND gate 44-2, a second AND gate 44-3, and an OR gate 44-4. The first AND gate 44-2 performs an AND operation on the output signal OUT_IP of the first buffer 30 and the output signal OUT_QN of the second buffer 32. The second AND gate 44-3 performs an AND operation on the output signal OUT_IN of the first buffer 30 and the output signal OUT_QP of the second buffer 32. The OR gate 44-4 receives the output signal of the first AND gate 44-2 and the output signal of the second AND gate 44-3, compares the phases of the output signals, and outputs a first comparison signal CP1.

The second phase detector 44-5 includes a third AND gate 44-6, a fourth AND gate 44-7, and a NOR gate 44-8. The third AND gate 44-6 performs an AND operation on the output signal OUT_IP of the first buffer 30 and the output signal OUT_QN of the second buffer 32. The fourth AND gate 44-7 performs an AND operation on the output signal OUT_IN of the first buffer 30 and the output signal OUT_QP of the second buffer 32. The NOR gate 44-8 receives the output signal of the third AND gate 44-6 and the output signal of the fourth AND gate 44-7, compares the phases of the output signals, and outputs a second comparison signal CP2.

The low pass filter 46 performs low pass filtering on the comparison signals CP1 and CP2 respectively output from the first and second phase detectors 44-1 and 44-5. The low pass filter 46 includes a first resistor R1 and a first capacitor C1 to perform low pass filtering on the first comparison signal CP1 and a second resistor R2 and a second capacitor C2 to perform low pass filtering on the second comparison signal CP2. That is, the low pass filter 46 performs low pass filtering on the first and second comparison signals CP1 and CP2 and outputs a first filter signal $DC_{XOR}$ and a second filter signal $DC_{XNOR}$.

The comparator COMP 48 is enabled in response to the calibration control signal Cal_end having a low level. The comparator COMP 48 compares the DC level of the first filter signal $DC_{XOR}$ and the DC level of the second filter signal $DC_{XNOR}$. When the DC level of the first filter signal $DC_{XOR}$ is higher than the DC level of the second filter signal $DC_{XNOR}$, that is, the phase difference between the output signal OUT_IP of the first buffer 30 and the output signal OUT_QP of the second buffer 32 is greater than 90°, the comparator COMP 48 outputs a comparison signal UP/DN having a high level. However, when the DC level of the first filter signal $DC_{XOR}$ is lower than the DC level of the second filter signal $DC_{XNOR}$, that is, the phase difference between the output I signal OUT_IP of the first buffer 30 and the output Q signal OUT_QP of the second buffer 32 is less than 90°, the comparator COMP 48 outputs a comparison signal UP/DN having a low level.

When the DC level of the first filter signal $DC_{XOR}$ is the same as that of the second filter signal $DC_{XNOR}$, the phase difference between the output I signal OUT_IP of the first buffer 30 and the output Q signal OUT_QP of the second buffer 32 is 90°.

The code generator 50 generates the digital code CODE to calibrate the phase of the output I signal OUT_IP and/or the output Q signal OUT_QP, in response to a calibration start signal Cal_Start, the calibration control signal Cal_end, a clock signal CLKcal, and the comparison signal UP/DN.

The digital code CODE may be sequentially increased or decreased according to the comparison signal UP/DN. The code generator 50 includes a clock generator 52 and a counter 54. The clock generator 52 outputs the calibration start signal Cal_Start and the clock signal CLKcal to operate the counter 54 based on the calibration control signal Cal_end and a reference clock CLKref. For example, when the calibration control signal Cal_end is a high level, the clock generator 52 does not generate the clock signal CLKcal. The counter 54 is operated in response to a calibration enable signal Cal_en. The calibration enable signal Cal_en controls a calibration mode in which the phase auto-calibration operation is performed. When the calibration enable signal Cal_en is a high level, the calibration control signal Cal_end is initialized to a low level.

When the calibration start signal Cal_Start is a high level, the counter 54 is reset to the initial value. Thus, the digital code CODE, for example, $D_N D_{N-1} \ldots D_N D_0$ output from the counter 54 is initialized to the initial value, for example, X00...00. The most significant bit (MSB) of the digital code CODE, that is, $D_{N=}X$, signifies the sign of the digital code CODE output from the counter 54. For example, $D_{N=}X=1$ signifies a positive number, whereas $D_{N=}X=0$ signifies a negative number.

$D_{N=}X=1$ signifies that the phase difference between the output I signal OUT_IP and the output Q signal OUT_QP is less than 90°. The MSB X is determined from the phase difference between the output I signal OUT_IP and the output Q signal OUT_QP generated when the output of the phase calibration circuit 60 is 0, that is, before the phase auto-calibration operation is performed. The output range of the digital code CODE output from the counter 54 is from 011...11 to 11...11. Whether to increase or decrease the digital code CODE is determined by the comparison signal UP/DN.

For example, when the comparison signal UP/DN output by the comparator COMP 48 is a high level, that is, the phase difference between the output I signal OUT_IP and the output Q signal OUT_QP is greater than 90°, the counter 54 outputs the digital code CODE that sequentially decreases. That is, to make the phase difference between the output I signal OUT_IP and the output Q signal OUT_QP less than 90°, the counter 54 outputs the digital code CODE that sequentially decreases.

Also, when the comparison signal UP/DN output by the comparator COMP 48 is a low level, that is, the phase difference between the output I signal OUT_IP and the output Q signal OUT_QP is less than 90°, the counter 54 outputs the digital code CODE that sequentially increases. That is, to make the phase difference between the output I signal OUT_IP and the output Q signal OUT_QP greater than 90°, the counter 54 outputs the digital code CODE that sequentially increases.

The above calibration operation signifies that a calibration loop is operated as a negative feedback. Thus, the phase auto-calibration circuit 11 outputs the digital code CODE that increases or decreases in order to maintain the phase difference between the output I signal OUT_IP and the output Q signal OUT_QP at 90°.

In other words, when the phase difference between the output I signal OUT_IP and the output Q signal OUT_QP is greater than 90°, the output signal UP/DN of the comparator COMP 48 is a high level. Thus, since the digital code CODE decreases, the phase calibration circuit 60 is operated in a direction to decrease the phase difference between the output I signal OUT_IP and the output Q signal OUT_QP, in response to the decreasing digital code CODE. In contrast, when the phase difference between the output I signal OUT_IP and the output Q signal OUT_QP is less than 90°, the output signal UP/DN of the comparator COMP 48 is a low level. Thus, since the digital code CODE increases, the phase calibration circuit 60 is operated in a direction to increase the phase difference between the output I signal OUT_IP and the output Q signal OUT_QP, in response to the increasing digital code CODE.

When the MSB of the digital code CODE is 0 or has a negative sign and the output signal UP/DN of the comparator COMP 48 is a low level, the counter 54 is operated as a down-counter. Thus, the counter 54 outputs an increasing digital code CODE. Also, when the MSB of the digital code CODE is 0 or has a negative sign and the output signal UP/DN of the comparator COMP 48 is a high level, the counter 54 is operated as an up-counter. Thus, the counter 54 outputs a decreasing digital code CODE.

When the MSB of the digital code CODE is 1 or has a positive sign and the output signal UP/DN of the comparator COMP 48 is a low level, the counter 54 is operated as an up-counter. Thus, the counter 54 outputs an increasing digital code CODE. Also, when the MSB of the digital code CODE is 1 or has a positive sign and the output signal UP/DN of the comparator COMP 48 is a high level, the counter 54 is operated as a down-counter. Thus, the counter 54 outputs a decreasing digital code CODE.

Table 1 shows the operation of the counter 54 according to the levels of the output signals $DC_{XOR}>DC_{XNOR}$ of the low pass filter 46, the level of the comparison signal UP/DN, and the MSB of the digital code CODE based on the phase difference $\Theta$.

TABLE 1

| Phase Difference ($\Theta$) | LPF Output | UP/DN | Counter State | $D_N$(=MSB) | Counter Operation |
|---|---|---|---|---|---|
| $\Theta > 90$ | $DC_{XOR} > DC_{XNOR}$ | HIGH | DOWN | 1 | DOWN COUNTER |
|  |  |  |  | 0 | UP COUNTER |
| $\Theta < 90$ | $DC_{XOR} < DC_{XNOR}$ | LOW | UP | 1 | UP COUNTER |
|  |  |  |  | 0 | DOWN COUNTER |
| $\Theta = 90$ | $DC_{XOR} = DC_{XNOR}$ | HIGH/2 | STOP | — | STOP |

The counter 54 stops its operation for the following two cases.

First, the counter 54 stops the operation when the comparison signal UP/DN is changed from a high level to a low level or from a low level to a high level, that is, the phase difference between two signals OUT_IP and OUT_QP is 90°.

Second, the counter 54 stops the operation when the digital code CODE output from the counter 54 reaches the maximum value, that is, 111 . . . 11, or the minimum value, that is, 011 . . . 11. The case is when the phase calibration range of the phase calibration circuit 60 does not cover the phase difference of the input signals IN_IP and IN_QP, or IN_IN and IN_QN. That is, although the phase difference between the two signals OUT_IP and OUT_QP is calibrated to be 90°, since the dynamic calibration range of the phase calibration circuit 60 is insufficient, the phase difference between the two signals OUT_IP and OUT_QP fails to be 90° and the calibration operation is completed.

When the condition to stop the phase calibration operation is met, the calibration control signal Cal_end is transited from the low level to the high level. That is, the counter 54 detects the case when the calibration operation is stopped and generates the calibration control signal Cal_end that transits from the low level to the high level according to a detection result. Thus, the switch SW 42, the phase detectors 44-1 and 44-5, and the comparator COMP 48 are disabled in response to the calibration control signal Cal_end having a high level. However, the first mixer 70 and the second mixer 72 perform a normal operation in response to the calibration control signal Cal_end having a high level. Also, since the counter 54 continuously outputs the digital code CODE that is finally output during the phase calibration operation, the output signals of the phase calibration circuit 60 are maintained without change. The counter 54 may be implemented by a ripple-carry counter.

The phase calibration circuit 60 includes a first digital-to-analog converter (DAC) 62 and a second DAC 64. The first DAC 62 controls the phases of the in-phase differential output signals OUT_IP and OUT_IN output from the first buffer 30, in response to the digital code CODE output from the counter 54 and the quadrature-phase differential input signals IN_QP and IN_QN. The second DAC 64 controls the phases of the quadrature-phase differential output signals OUT_QP and OUT_QN output from the second buffer 32, in response to the digital code CODE output from the counter 54 and the in-phase differential input signals IN_IP and IN_IN.

During the phase auto-calibration operation, the output signals OUT_IP and OUT_IN of the first buffer 30 and the output signals of the first DAC 62 are combined with each other, and the output signals OUT_QP and OUT_QN of the second buffer 32 and the output signals of the second DAC 64 are combined with each other. The combined signals OUT_IP, OUT_IN, OUT_QP, and OUT_QN are input to the phase detectors 44-1 and 44-5 via the switch SW 42.

When the phase difference between the output I signal OUT_IP and the output Q signal OUT_QP is maintained at 90°, the duty of the output (=the first comparison signal) CP1 of the OR gate 44-4 is 180° and the duty of the output (=the second comparison signal) CP2 of the NOR gate 44-8 is 180°. Thus, the DC level of the first filter signal $DC_{XOR}$ and the DC level of the second filter signal $DC_{XNOR}$ are the same.

When the phase difference between the output I signal OUT_IP and the output Q signal OUT_QP is less than 90°, the duty of the output (=the first comparison signal) CP1 of the OR gate 44-4 is less than 180° and the duty of the output (=the second comparison signal) CP2 of the NOR gate 44-8 is greater than 180°. Thus, the DC level of the second filter signal $DC_{XNOR}$ is greater than the DC level of the first filter signal $DC_{XOR}$.

When the phase difference between the output I signal OUT_IP and the output Q signal OUT_QP is greater than 90°, the duty of the output (=the first comparison signal) CP1 of the OR gate 44-4 is greater than 180° and the duty of the output (=the second comparison signal) CP2 of the NOR gate 44-8 is less than 180°. Thus, the DC level of the first filter signal $DC_{XOR}$ is greater than the DC level of the second filter signal $DC_{XNOR}$. As a result, by comparing the DC level of the first filter signal $DC_{XOR}$ and the DC level of the second filter signal $DC_{XNOR}$ using the comparator COMP 48, it may be determined whether the phase difference between the two signals OUT_IP and OUT_QP is 90°, greater than 90°, or less than 90°.

Also, the low pass filter 46 performs low pass filtering on the comparison signals CP1 and CP2, each including a RF, to output the respective DC signals $DC_{XOR}$ and $DC_{XNOR}$. As shown in Table 1, when the DC levels of the first and second filter signals $DC_{XOR}$ and $DC_{XNOR}$ are the same, the comparator COMP 48 outputs an intermediate value between the high level and the low level.

Figure 2:
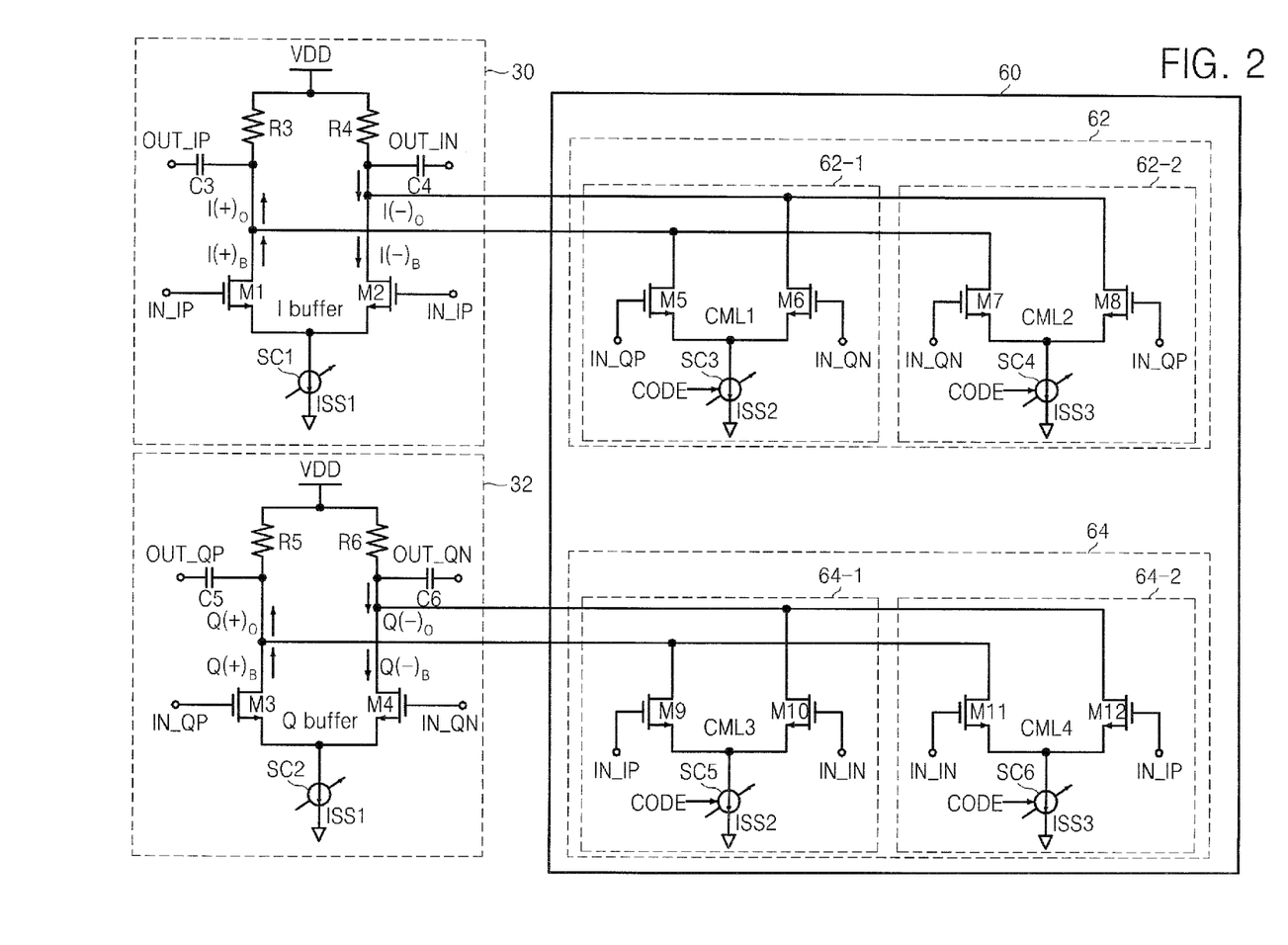
FIG. 2 is a circuit diagram of the first buffer, the second buffer, and the phase calibration circuit of FIG. 1.

FIG. 2 is a circuit diagram of the first buffer 30, the second buffer 32, and the phase calibration circuit 60 of FIG. 1 in detail. Referring to FIGS. 1 and 2, the phase calibration circuit 60 includes the first DAC 62 and the second DAC 64. The first DAC 62 includes a first current mode logic (CML) 62-1 and a second CML 62-2 which are connected in parallel to output terminals of the first buffer 30. The second DAC 64 includes a third CML 64-1 and a fourth CML 62-2 which are connected in parallel to output terminals of the second buffer 32. Each of the first CML 62-1 and the second CML 62-2 receives the digital code CODE and the quadrature-phase differential input signals IN_QP and IN_QN. Each of the third CML 64-1 and the fourth CML 64-2 receives the digital code CODE and the in-phase differential input signals IN_IP and IN_IN.

Each of the first through fourth CMLs 62-1, 62-2, 64-1, and 64-2 is enabled or disabled by the MSB of the digital code CODE output from the counter 54. For example, when the MSB of the digital code CODE is 0, to decrease the phase difference between the in-phase differential output signal OUT_IP and the quadrature-phase differential output signal OUT_QP, each of the first CML 62-1 and the third CML 64-1 is enabled and each of the second CML 62-2 and the fourth CML 64-2 is disabled.

Also, when the MSB of the digital code CODE is 1, to increase the phase difference between the in-phase differential output signal OUT_IP and the quadrature-phase differential output signal OUT_QP, each of the second CML 62-2 and the fourth CML 64-2 is enabled and each of the first CML 62-1 and the third CML 64-1 is disabled.

Figure 3:
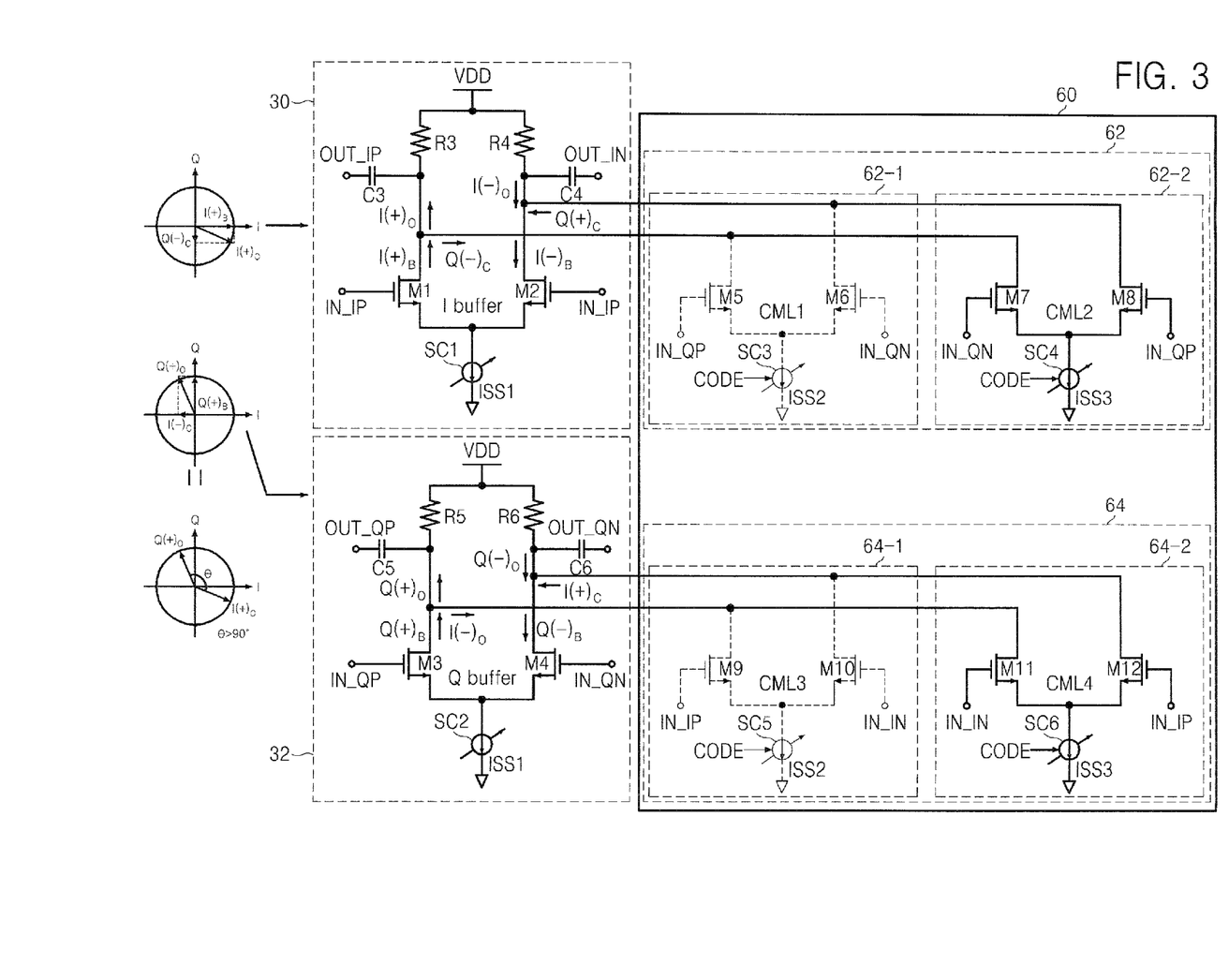
FIG. 3 is a circuit diagram for explaining the operation of each current mode logic of FIG. 2.

FIG. 3 is a circuit diagram for explaining the operation of each current mode logic of FIG. 2. FIG. 3 illustrates a case in which the second CML 62-2 and the fourth CML 64-2 are enabled. Referring to FIGS. 1-3, the phase auto-calibration circuit 11 performs an operation to maintain the phase difference between the output I signal OUT_IP and the output Q signal OUT_QP to be 90° when the phase difference between the output I signal OUT_IP and the output Q signal OUT_QP is less than 90°.

As illustrated in FIG. 3, when the MSB of the digital code CODE output from the counter 54 is 1, the second and fourth CMLs 62-2 and 64-2 only are enabled.

Current ISS3 flowing in a current source SC4 of the second CML 62-2 is controlled according to the digital code CODE. When the current ISS3 flowing in the current source SC4 is controlled, the value of current $Q(-)_C$ flowing in a transistor M7 and the value of current $Q(+)_C$ flowing in a transistor M8 are changed. Thus, the value of each of currents $I(+)_0$ and $I(-)_0$ is changed according to the Kirchhoff's current law. That is, since the first DAC 62 may control the values of the currents $I(+)_0$ and $I(-)_0$ flowing in the first buffer 30 according to the quadrature-phase differential input signals IN_QP and IN_QN and the digital code CODE, the first DAC 62 may control the phase of each of the in-phase differential output signals OUT_IP and OUT_IN.

Similarly, the current ISS3 flowing in a current source SC6 of the fourth CML 64-2 is controlled according to the digital code CODE. When the current ISS3 flowing in the current source SC6 is controlled, the value of current $I(-)_C$ flowing in a transistor M11 and the value of current $I(+)_C$ flowing in a transistor M12 are changed. Thus, the value of each of currents $Q(+)_0$ and $Q(-)_0$ is changed. That is, since the second DAC 64 may control the values of the currents $Q(+)_0$ and $Q(-)_0$ flowing in the second buffer 32 according to the in-phase differential input signals IN_IP and IN_IN and the digital code CODE, the second DAC 64 may control the phase of each of the quadrature-phase differential output signals OUT_QP and OUT_QN.

The phase auto-calibration circuit 11 may increase the phase difference between the output I signal OUT_IP and the output Q signal OUT_QP to make the phase difference 90° by using the sum of a vector value of the current $I(+)_0$ varied by the second CML 62-2 and a vector value of the current $Q(+)_0$ varied by the fourth CML 64-2.

Figure 4:
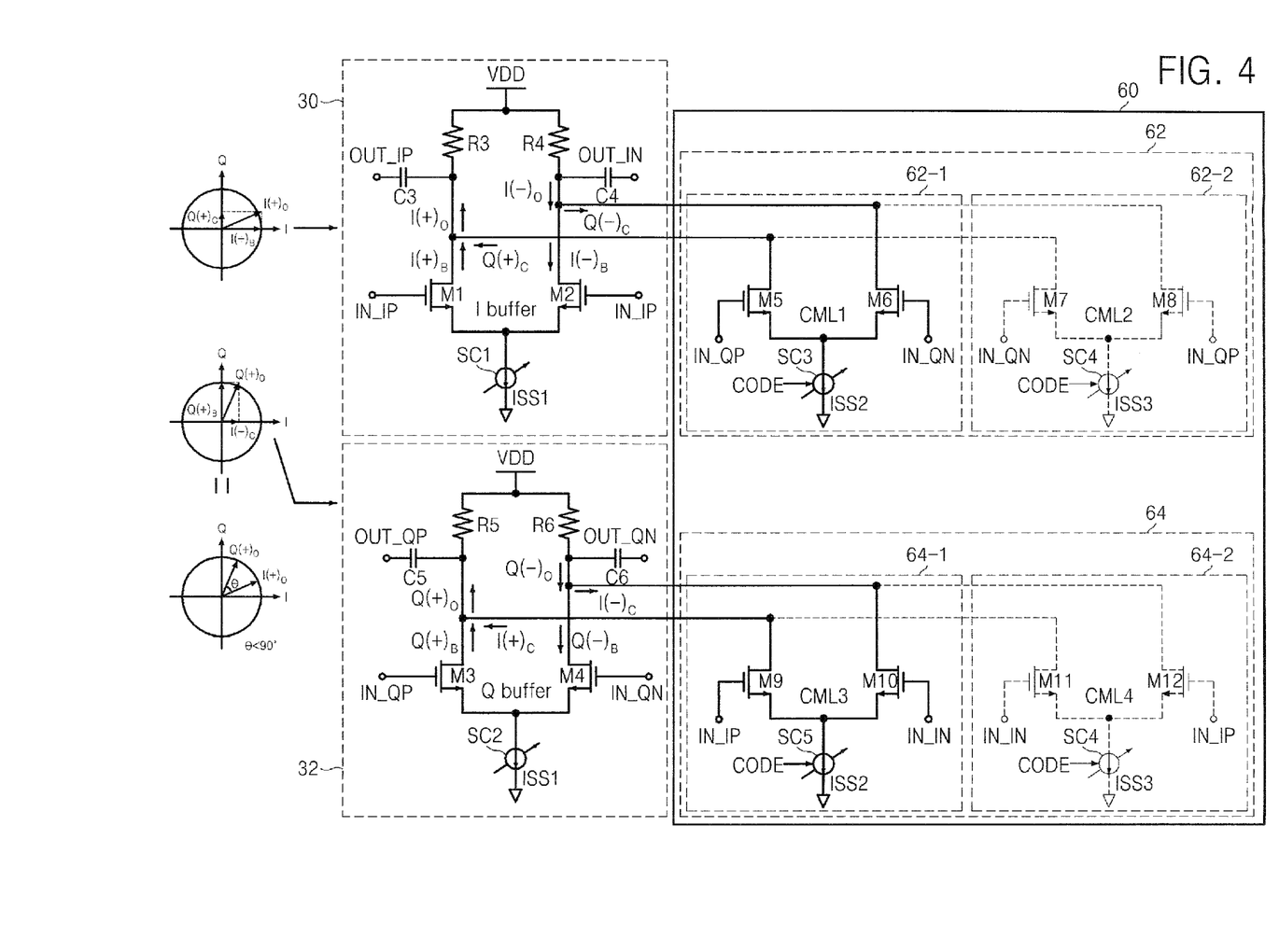
FIG. 4 is another circuit diagram for explaining the operation of each current mode logic of FIG. 2.

FIG. 4 is another circuit diagram for explaining the operation of each current mode logic of FIG. 2. FIG. 4 illustrates a case in which the first CML 62-1 and the third CML 64-1 are enabled. Referring to FIGS. 1, 2, and 4, the phase auto-calibration circuit 11 performs an operation to maintain the phase difference of the two signals OUT_IP and OUT_QP at 90° when the phase difference between the output I signal OUT_IP and the output Q signal OUT_QP is greater than 90°. As illustrated in FIG. 4, when the MSB of the digital code CODE output from the counter 54 is 0, only the first and third CMLs 62-1 and 64-1 are enabled.

Current ISS2 flowing in a current source SC3 of the first CML 62-1 is controlled according to the digital code CODE. When the current ISS2 flowing in the current source SC3 of the first CML 62-1 is controlled, the value of current $Q(+)_C$ flowing in a transistor M5 and the value of current $Q(-)_C$ flowing in a transistor M6 are changed. Thus, the value of each of currents $Q(+)_0$ and $Q(-)_0$ is changed. That is, since the first DAC 62 may control the values of the currents $I(+)_0$ and $I(-)_0$ flowing in the first buffer 30 according to the quadrature-phase differential input signals IN_QP and IN_QN and the digital code CODE, the first DAC 62 may control the phase of each of the quadrature-phase differential output signals OUT_QP and OUT_QN.

The current ISS2 flowing in a current source SC5 of the third CML 64-1 is controlled according to the digital code CODE. When the current ISS2 flowing in the current source SC5 of the third CML 64-1 is controlled, the value of current $I(+)_C$ flowing in a transistor M9 and the value of current $I(-)_C$ flowing in a transistor M10 are changed. Thus, the value of each of currents $Q(+)_0$ and $Q(-)_0$ is changed. That is, since the second DAC 64 may control the values of the currents $Q(+)_0$ and $Q(-)_0$ flowing in the second buffer 32 according to the in-phase differential input signals IN_IP and IN_IN and the digital code CODE, the second DAC 64 may control the phase of each of the quadrature-phase differential output signals OUT_QP and OUT_QN.

The phase auto-calibration circuit 11 may decrease the phase difference between the output I signal OUT_IP and the output Q signal OUT_QP to make the phase difference 90° by using the sum of a vector value of the current $I(+)_0$ varied by the first CML 62-1 and a vector value of the current $Q(+)_0$ varied by the third CML 64-1.

Figure 5:
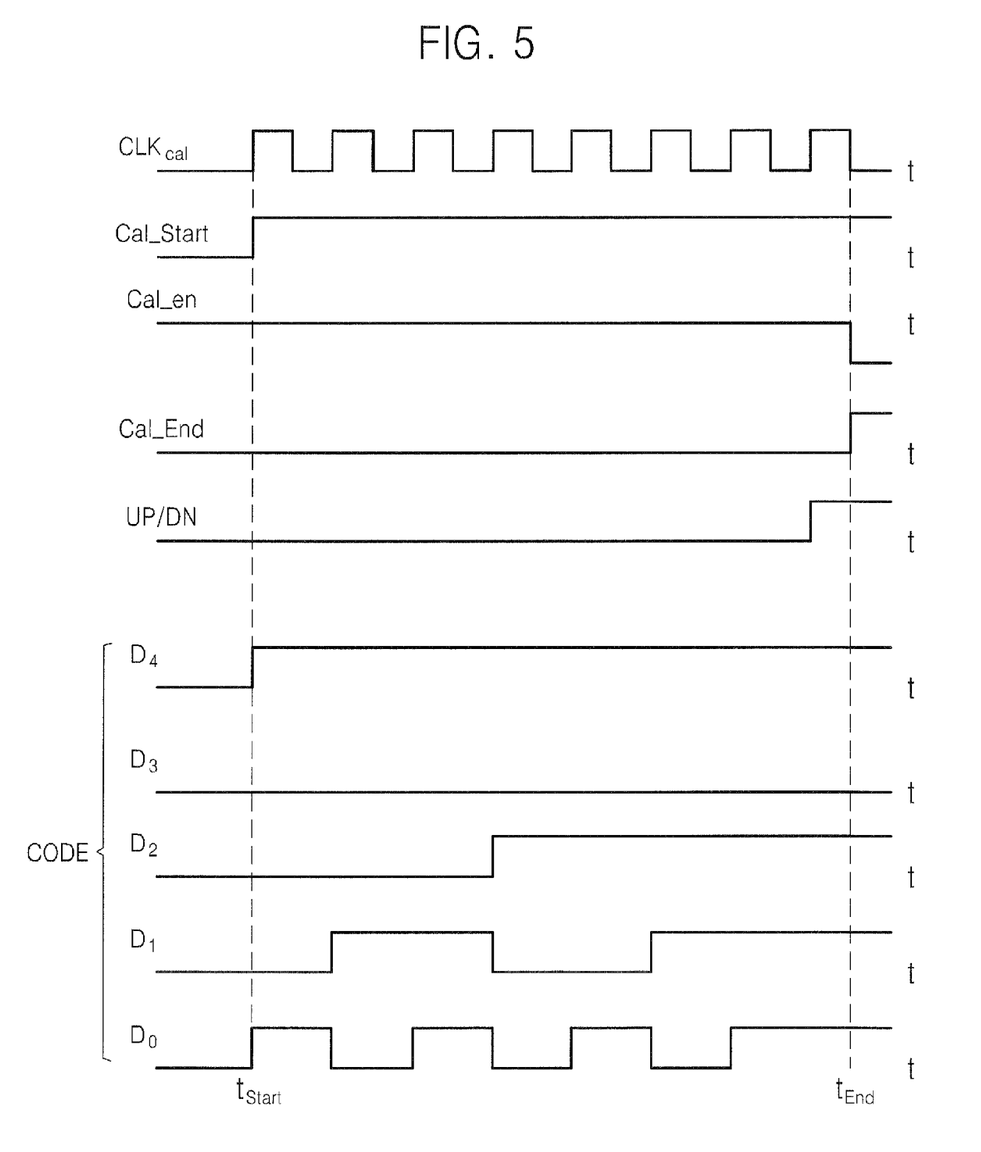
FIG. 5 is a timing diagram of control signals controlling the operation of the counter of FIG. 1.

FIG. 5 is a timing diagram of control signals controlling the operation of the counter of FIG. 1. FIG. 5 illustrates a case in which the digital code CODE is 5 bits for convenience of explanation. Referring to FIGS. 1-5 and Table 1, during the phase auto-calibration operation, the clock generator 52 generates the calibration start signal Cal_Start and the clock signal CLKcal in response to the calibration control signal Cal_end having a low level.

The counter 54 is operated in response to the calibration enable signal Cal_en. The calibration enable signal Cal_en controls the calibration mode. When the calibration enable signal Cal_en is a high level, the calibration control signal Cal_end is initialized to a low level.

The first filter signal $DC_{XOR}$ and the second filter signal $DC_{XNOR}$ are supplied to the comparator COMP 48. When the DC level of the first filter signal $DC_{XOR}$ is lower than the DC level of the second filter signal $DC_{XNOR}$, that is, the phase difference between the output I signal OUT_IP and the output Q signal OUT_QP is less than 90°, the comparator COMP 48 outputs a comparison signal UP/DN having a low level.

The counter 54 outputs the digital code CODE that increases, to increase the phase difference between the output I signal OUT_IP and the output Q signal OUT_QP. The counter 54 may be operated as an up-counter or a down-counter according to the MSB of the digital code CODE.

When the phase difference between the output I signal OUT_IP and the output Q signal OUT_QP is 90°, the counter 54 is stopped and outputs the calibration control signal Cal_end that transits from the low level to the high level. Thus, the phase auto-calibration is completed. The digital code CODE generated when the calibration control signal Cal_end is transited from the low level to the high level is supplied to the phase calibration circuit 60. Accordingly, during the normal operation, the phase calibration circuit 60 controls to maintain the phase difference between the output I signal OUT_IP and the output Q signal OUT_QP at 90°, in response to the digital code CODE. That is, when the calibration control signal Cal_end is transited from the low level to the high level, the clock generator 52 does not supply the clock signal CLKcal to the counter 54. Thus, the counter 54 may maintain the digital code CODE at the transition.

Figure 6:
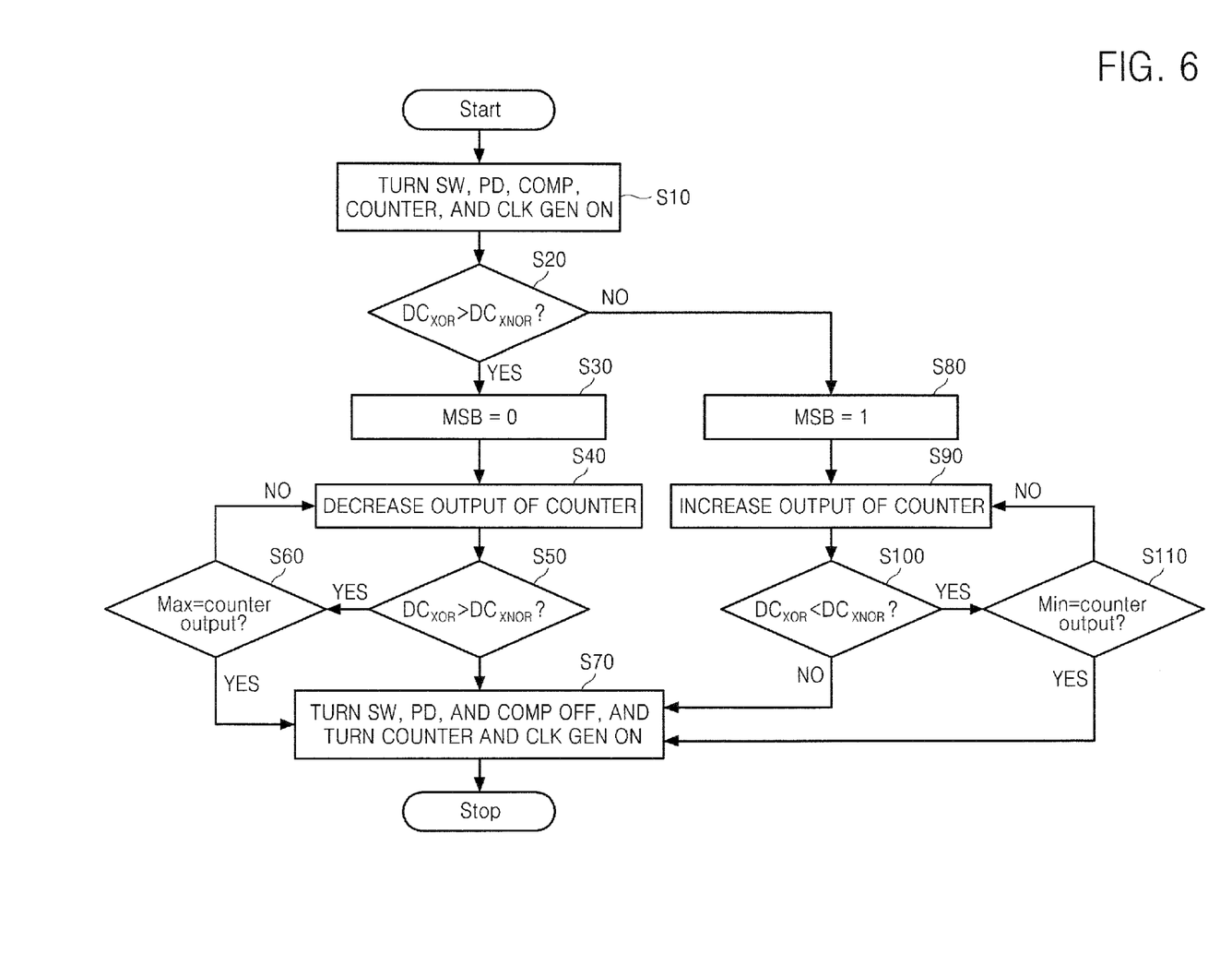
FIG. 6 is a flowchart for explaining the algorithm of a phase auto-calibration operation according to an exemplary embodiment of the present inventive concept.

FIG. 6 is a flowchart for explaining the algorithm of a phase auto-calibration operation according to an exemplary embodiment of the present inventive concept. Referring to FIGS. 1-6, in the phase auto-calibration operation, first, the counter 54 generates a calibration control signal Cal_end having a low level. Although in FIG. 1 the counter 54 generates the calibration control signal Cal_end, the calibration control signal Cal_end may be generated by a controller (not shown) according to an exemplary embodiment. The switch SW 42, the phase detectors 44-1 and 44-5, the comparator COMP 48, the counter 54, and the clock generator 52 are enabled in response to the calibration control signal Cal_end having a low level, whereas the first mixer 70 and the second mixer 72 are disabled (S10).

The comparator COMP 48 compares the DC level of the first filter signal $DC_{XOR}$ and the DC level of the second filter signal $DC_{XNOR}$. When the DC level of the first filter signal $DC_{XOR}$ is higher than the DC level of the second filter signal $DC_{XNOR}$, that is, the phase difference between the output signal OUT_IP and the output signal OUT_QP is greater than 90°, the MSB of the counter 54 is 0 (S30). Thus, the counter 54 outputs the digital code CODE that is down-counted, to decrease the phase difference between the two signals OUT_IP and OUT_QP (S40).

The comparator COMP 48 continues to compare the DC level of the first filter signal $DC_{XOR}$ with the DC level of the second filter signal $DC_{XNOR}$ (S50). When the DC level of the first filter signal $DC_{XOR}$ is still higher than the DC level of the second filter signal $DC_{XNOR}$, the counter 54 determines whether the current digital code CODE is the maximum value (S60). The counter 54 repeatedly performs the operations S40 and S50 until the current digital code CODE is the maximum value. When the current digital code CODE is the maximum value as a result of the operations S40 and S50, the phase auto-calibration operation is completed. Also, when the phase difference between the output signals OUT_IP and OUT_QP is decreased to 90°, the phase auto-calibration operation is completed.

The counter 54 outputs the phase control signal Cal_end having a high level. Thus, while the switch SW 42, the phase detectors 44-1 and 44-5, and the comparator COMP 48 are disabled, the counter 54 and the clock generator 52 are enabled (S70). However, since the clock generator 52 does not output the clock signal CLKcal, the counter 54 maintains the digital code CODE just before the phase control signal Cal_end is transited to the high level.

As a result of the operation S20, when the DC level of the first filter signal $DC_{XOR}$ is lower than the DC level of the second filter signal $DC_{XNOR}$, that is, the phase difference between the output signal OUT_IP and the output signal OUT_QP is less than 90°, the MSB of the counter 54 is 1 (S80). Thus, the counter 54 outputs the digital code CODE that is up-counted, to increase the phase difference between the two signals OUT_IP and OUT_QP (S90). The comparator COMP 48 continues to compare the DC level of the first filter signal $DC_{XOR}$ with the DC level of the second filter signal $DC_{XNOR}$ (S100). When the DC level of the first filter signal $DC_{XOR}$ is still lower than the DC level of the second filter signal $DC_{XNOR}$, the counter 54 determines whether the current digital code CODE is the minimum value (S110).

The counter 54 repeatedly performs the operations S90 and S100 until the current digital code CODE is the minimum value. When the current digital code CODE is the minimum value as a result of the operations S90 and S100, the phase auto-calibration operation is completed. Also, as a result of the operation S100, when the phase difference between the output signals OUT_IP and OUT_QP is decreased to 90°, the phase auto-calibration operation is completed. Thus, the counter 54 outputs the phase control signal Cal_end having a high level. Thus, the switch SW 42, the phase detectors 44-1 and 44-5, and the comparator COMP 48 are disabled, whereas the counter 54 and the clock generator 52 maintain the enabled state (S70). However, since the clock generator 52 does not output the clock signal CLKcal, the counter 54 maintains the digital code CODE just before the phase control signal Cal_end is transited to the high level.

As described above, the phase calibration method and circuit according to the present inventive concept may continuously control the output I signal and/or the output Q signal without frequency doubling or dividing. Thus, the phase calibration method and circuit may maintain the phase difference between the output I signal and/or the output Q signal at 90°.

While the inventive concept has been particularly shown and described with reference to exemplary embodiments thereof, it will be understood that various changes in form and details may be made therein without departing from the spirit and scope of the following claims.

What is claimed is:

1. A method for calibrating a phase, the method comprising:

comparing a phase of an in-phase output signal and a phase of a quadrature-phase output signal and generating a digital code corresponding to a comparison result; and
controlling the phase of the in-phase output signal in response to quadrature-phase differential input signals and the digital code, and controlling the phase of the quadrature-phase output signal in response to in-phase differential input signals and the digital code, to make a phase difference between the in-phase output signal and the quadrature-phase output signal 90°.

2. A circuit for calibrating phases of signals output from a local oscillator, the circuit comprising:
   a first buffer for outputting an in-phase output signal;
   a second buffer for outputting a quadrature-phase output signal;
   a code generation circuit for comparing a phase of the in-phase output signal and a phase of the quadrature-phase output signal and generating a digital code corresponding to a comparison result; and
   a phase calibration circuit for controlling the phase of the in-phase output signal in response to quadrature-phase differential input signals and the digital code, and controlling the phase of the quadrature-phase output signal in response to in-phase differential input signals and the digital code, to make the phase difference between the in-phase output signal and the quadrature-phase output signal 90°.

3. The circuit of claim 2, wherein the code generation circuit comprises:
   a phase detector for detecting the phase difference between the in-phase output signal and the quadrature-phase output signal and generating a first detection signal and a second detection signal;
   a low pass filter for performing low pass filtering on each of the first and second detection signals and generating a first filter signal and a second filter signal;
   a comparator for comparing the first and second filter signals and outputting a comparison signal; and
   a code generator for generating the digital code according to a clock signal and the comparison signal.

4. The circuit of claim 3, wherein the code generator generates the digital code that is up-counted or down-counted according to a level of the comparison signal and the clock signal.

5. The circuit of claim 3, wherein the code generator generates a calibration control signal to control an operation of the comparator based on a change of the level of the comparison signal.

6. The circuit of claim 2, wherein the phase calibration circuit comprises:
   a first digital-to-analog converter for controlling the phase of the in-phase output signal in response to the quadrature-phase differential input signals and the digital code; and
   a second digital-to-analog converter for controlling the phase of the quadrature-phase output signal in response to the in-phase differential input signals and the digital code.

7. The circuit of claim 6, wherein the first digital-to-analog converter comprises a plurality of first digital-to-analog units to control the phase of the in-phase output signal, each of the plurality of first digital-to-analog units being connected in parallel to output terminals of the first buffer,
   the second digital-to-analog converter comprises a plurality of second digital-to-analog units to control the phase of the quadrature-phase output signal, each of the plurality of second digital-to-analog units being connected in parallel to output terminals of the second buffer, and
   each of the plurality of first digital-to-analog units and each of the plurality of second digital-to-analog units are enabled/disabled based on the most significant bit (MSB) of the digital code.

8. A wireless signal processing apparatus comprising:
   a first buffer for outputting an in-phase output signal;
   a second buffer for outputting a quadrature-phase output signal;
   a first mixer for mixing an output signal of the first buffer and an in-phase baseband output signal;
   a second mixer for mixing an output signal of the second buffer and a quadrature-phase baseband output signal;
   a code generation circuit for comparing a phase of the in-phase output signal and a phase of the quadrature-phase output signal and generating a digital code corresponding to a comparison result; and
   a phase calibration circuit for controlling the phase of the in-phase output signal in response to quadrature-phase differential input signals and the digital code, and controlling the phase of the quadrature-phase output signal in response to in-phase differential input signals and the digital code, to make a phase difference between the in-phase output signal and the quadrature-phase output signal 90°.

9. The wireless signal processing apparatus of claim 8, wherein the code generation circuit comprises:
   a phase detector for detecting the phase difference between the in-phase output signal and the quadrature-phase output signal and generating a first detection signal and a second detection signal;
   a low pass filter for performing low pass filtering on each of the first and second detection signals and generating a first filter signal and a second filter signal;
   a comparator for comparing the first and second filter signals and outputting a comparison signal; and
   a code generator for generating the digital code according to a clock signal and the comparison signal.

10. The wireless signal processing apparatus of claim 9, wherein the code generator generates a calibration control signal based on a change of a level of the comparison signal, and the wireless signal processing apparatus further comprises a switch for transmitting the in-phase output signal and the quadrature-phase output signal to the code generation circuit in response to the calibration control signal.

* * * * *